(12) United States Patent
Fenstermaker et al.

(10) Patent No.: US 7,196,963 B1
(45) Date of Patent: Mar. 27, 2007

(54) ADDRESS ISOLATION FOR USER-DEFINED CONFIGURATION MEMORY IN PROGRAMMABLE DEVICES

(75) Inventors: Larry R. Fenstermaker, Nazareth, PA (US); Sajitha Wijesuriya, Macungie, PA (US); Harold N. Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/251,682

(22) Filed: Oct. 17, 2005

(51) Int. Cl.
*G11C 8/00* (2006.01)
*G11C 7/10* (2006.01)

(52) U.S. Cl. ............... 365/230.05; 365/189.04; 365/189.08

(58) Field of Classification Search ............ 365/230.05
See application file for complete search history.

(56) References Cited

U.S. PATENT DOCUMENTS

| | | | | |
|---|---|---|---|---|
| 4,833,649 A | * | 5/1989 | Greub ................... | 365/189.06 |
| 5,241,510 A | * | 8/1993 | Kobayashi et al. ..... | 365/230.03 |
| 5,883,852 A | * | 3/1999 | Ghia et al. ............. | 365/230.05 |
| 6,288,970 B1 | * | 9/2001 | Reddy et al. .......... | 365/230.05 |
| 6,747,903 B1 | * | 6/2004 | Pan et al. .............. | 365/189.01 |
| 6,809,984 B2 | * | 10/2004 | Nagano ................ | 365/230.05 |
| 6,990,025 B2 | * | 1/2006 | Kirihata et al. ........ | 365/189.07 |
| 7,054,217 B2 | * | 5/2006 | Yamada ................ | 365/230.05 |
| 7,110,304 B1 | * | 9/2006 | Yu et al. ................ | 365/189.02 |
| 2005/0152204 A1 | * | 7/2005 | Lee et al. .............. | 365/230.05 |

* cited by examiner

*Primary Examiner*—Son L. Mai
(74) *Attorney, Agent, or Firm*—Steve Mendelsohn

(57) ABSTRACT

In one embodiment of the invention, a block of configuration memory has rows of memory cells, at least one row having a set of one or more dual-port memory cells adapted to selectively store either configuration data or local data. The configuration address line for that row is segmented such that the address line is connected to the configuration address ports of the dual-port memory cells via access control circuitry that can be programmably configured to prevent access to those memory cells via the configuration address line. The access control circuitry enables local data to be efficiently and accurately stored in the dual-port memory cells without interference from configuration readback operations during normal operation or from partial reconfiguration of the configuration memory.

19 Claims, 4 Drawing Sheets

ADDRESS ISOLATION FOR USER-DEFINED CONFIGURATION MEMORY IN PROGRAMMABLE DEVICES

TECHNICAL FIELD

The present invention relates to programmable devices, such as field-programmable gate arrays (FPGAs), and, in particular, to configuration memory for such devices.

BACKGROUND

FIG. 1 shows a high-level block diagram of the layout of a conventional field-programmable gate array (FPGA) 100 having a logic core 102 surrounded by an input/output (I/O) ring 104. Logic core 102 includes an array of programmable logic blocks (PLBs) 106 (also referred to in the art as programmable logic cells, logic array blocks, or configurable logic blocks) intersected by rows of block memory 108. Each PLB contains circuitry that can be programmed (i.e., configured) to perform a variety of different functions. The memory blocks in each row are available to store data to be input to the PLBs and/or data generated by the PLBs. I/O ring 104 includes sets of I/O buffers 110 programmably connected to the logic core by multiplexer/demultiplexer (mux/demux) circuits 112. The I/O buffers support external interfacing to FPGA 100. Also located within the I/O ring are a number of phase-locked loop (PLL) circuits 114 that are capable of providing different timing signals for use by the various elements within FPGA 100. Those skilled in the art will understand that FPGAs, such as FPGA 100, will typically include other elements, such as additional configuration memory, that are not shown in the high-level block diagram of FIG. 1. In addition, general routing resources, including clocks, buses, general-purpose routing, high-speed routing, etc. (also not shown in FIG. 1), are provided throughout the FPGA layout to programmably interconnect the various elements within FPGA 100.

The layout of FPGA 100 comprises multiple instances of a limited number of different types of blocks of circuitry. For example, I/O ring 104 contains a number of instances of the same basic block of programmable I/O circuitry repeated around the periphery of the device. Similarly, each PLB 106 within logic core 102 may be implemented using a different instance of the same set of programmable logic circuitry. Furthermore, each row of block memory 108 may contain one or more instances of the same block of memory that may be designed, for example, for use as configuration memory for the FPGA.

FIG. 2 shows a schematic block diagram of an exemplary conventional block 200 of configuration memory for use in an FPGA, such as FPGA 100 of FIG. 1. Configuration memory block 200 includes three rows 202–206 of static random-access memory (SRAM) cells and a shift register 208 formed by three flip-flops (FFs) SR1–3 connected in cascade.

Shift register 208 enables the rows of SRAM cells in block 200 to be sequentially accessed starting with row 202, followed by row 204, and lastly row 206. In particular, when a one-clock-cycle pulse is applied to address line ADD0, the pulse, which is applied at the D input of FF SR1, will appear at the Q output of FF SR1 at the next rising edge of clock CK, which applies the pulse both to the address ports ADD of the SRAM cells in row 202 (thereby enabling access to those SRAM cells) as well as to the D input of FF SR2. At the next rising edge of clock CK, the pulse will appear at the Q output of FF SR2, which applies the pulse both to the address ports ADD of the SRAM cells in row 204 as well as to the D input of FF SR3. At the next rising edge of clock CK, the pulse will appear at the Q output of FF SR3, which applies the pulse to the address ports ADD of the SRAM cells in row 206.

Exemplary configuration memory block 200 includes two different types of SRAM cells: single-port memory cells that are used only for configuration operations (e.g., storing configuration data used to control configuration multiplexers (muxes) in the FPGA) and dual-port memory cells that can be used for either configuration data storage or local data storage (e.g., storing so-called "local" data associated with user data-processing operations of the FPGA that are not related to configuration operations). In particular, rows 202 and 206 contain only single-port memory cells (labeled "mc" in FIG. 2), while row 204 includes both single-port memory cells and dual-port memory cells (labeled "dp mc").

As represented for the single-port memory cells in row 202 of FIG. 2 (but which in fact applies to all of the single-port memory cells in block 200), the Q output of each single-port memory cell is connected to the control port SD of a different configuration mux 210 to control whether the value at the mux's data input D0 or the mux's data input D1 is presented at the mux's data output Z.

FIG. 3 shows a schematic diagram of a typical SRAM memory cell 300 that can be used to implement each single-port memory cell in configuration memory block 200 of FIG. 2. If address line ADD is high, then transistors 302 and 304 (e.g., MOSFETs) are on, enabling one bit of configuration data appearing as complementary signals on input data lines DATA, DATAN to be stored in latch 306 and presented at the memory cell's output port, labeled MUX_CONTROL. If address line ADD is low, then transistors 302 and 304 are off, and latch 306 retains its previously stored value and continues to present that value at the cell's output port MUX_CONTROL. Note that, for each single-port memory cell in the higher-level block diagram of FIG. 2, the configuration-data input ports DATA and DATAN of FIG. 3 are not shown in FIG. 2, and the Q output in FIG. 2 is the output port MUX_CONTROL of FIG. 3.

Referring again to FIG. 2, memory cell 212 is one of the four dual-port memory cells in row 204 of configuration memory block 200. In addition to the complementary configuration-data input ports (which are not shown in FIG. 2), dual-port memory cell 212 also has a local-data input port DIN. As mentioned above, dual-port memory cell 212 supports two different functions: (1) storage of configuration data used to control a configuration mux and (2) storage of local data.

The storage of configuration data is accomplished in the same manner as for the single-port memory cells. In particular, if row address line ADD2 is high, then one bit of configuration data can be written into memory cell 212 for use in controlling a configuration mux, in this case, configuration mux 214.

If memory cell 212 is not needed to store configuration data (e.g., memory cell 212 had previously been used to store configuration data, but is no longer needed to store that configuration data), then memory cell 212 is available for use in storing local data. As represented in FIG. 2, local-data mux 216 provides (1) one bit of local data (LOCAL_DATA_IN) to the Q port of memory cell 212 via transistor gate 218 and (2) an inverted version of that local-data bit to the DIN port of memory cell 212 via inverter 220 and transistor gate 222, where configuration mux 224 provides local address signal LOCAL_ADD, which determines whether or not that bit of local data is written into memory cell 212. Moreover, in addition to being connected to the control input of configuration mux 214, the Q output of memory cell 212 is also connected to the D0 input port of configuration mux 226.

If row address line ADD2 is low and if local address line LOCAL_ADD is high, then the local-data bit LOCAL_DATA_IN from local-data mux 216 will be stored in memory cell 212. In order to speed up this local data processing, in addition to the stored local-data bit being applied to the D0 input of configuration mux 226 via memory cell output port Q, the local-data bit is also applied (more) directly to that D0 input via transistor gate 218. If both row address line ADD2 and local address line LOCAL_ADD are low, then the previously stored value in memory cell 212 is applied to both the control input SD of configuration mux 214 and the D0 input of configuration mux 226, whether that previously stored value was configuration data or local data.

FIG. 4 shows a schematic diagram of a typical SRAM memory cell 400 that can be used to implement each dual-port memory cell in configuration memory block 200 of FIG. 2, such as memory cell 212. Note that, in addition to memory cell 400, FIG. 4 shows inverter 220 and transistor gates 218 and 222 of FIG. 2.

Dual-port memory cell 400 has two address lines: (1) configuration address line ADD, which controls configuration-data transistor gates 402 and 404, and (2) local address line LOCAL_ADD, which controls local-data transistor gates 218 and 222. Dual-port memory cell 400 also has two sets of input ports: (1) complementary configuration-data input ports DATA and DATAN, which are applied to latch 406 via gates 402 and 404, and (2) local-data input port LOCAL_DATA_IN, whose value is applied to latch 406 via inverter 220 and gates 218 and 222. As such, ports Q and DIN may be considered to be a pair of complementary local-data input ports for memory cell 400.

Note that, for memory cell 212 in the higher-level block diagram of FIG. 2:

Configuration-data input ports DATA and DATAN of FIG. 4 are not shown in FIG. 2;
Configuration address line ADD2 in FIG. 2 is configuration address line ADD of FIG. 4; and
The Q output in FIG. 2 is both the output port MUX_CONTROL and the output port LOCAL_DATA_OUT of FIG. 4.

Note further that the additional circuitry of dual-port memory cell 400 of FIG. 4 (as compared with that of single-port memory cell 300 of FIG. 3) enables a single bit of local data to be written into memory cell 212 of FIG. 2 without having to access all of the memory cells in row 204 using configuration address line ADD2.

In a typical block of configuration memory, such as block 200 of FIG. 2, memory cells are arranged in rows and columns, where the memory cells in each row share the same address line (e.g., ADDi of FIG. 2) and the memory cells in each column share the same complementary pair of configuration data lines (e.g., DATA and DATAN of Figs. B and C). The capacitance on the configuration-data input ports (i.e., DATA and DATAN) of each SRAM memory cell, such as either memory cell 300 of FIG. 3 or memory cell 400 of FIG. 4, is a function of the number of memory cells in each column. Configuration memory blocks having larger number of rows will have memory cells with higher capacitances. These high capacitances limit the speeds at which data can be written into the memory cells, when corresponding address line ADDi is high. Since relatively slow configuration operations are acceptable (e.g., 20 MHz for configuration access vs. 400 MHz for local access), the typical high capacitance levels on DATA and DATAN are tolerable for configuration writes, but not for local data writes.

Conventional FPGAs perform soft error-detection operations, in which the data stored in memory is periodically read in order to verify that the data is correct. When such operations are implemented for configuration memory block 200 of FIG. 2, rows 202–206 will typically be sequentially accessed via configuration address lines ADD1–ADD3, with the data stored in the corresponding memory cells being sensed via signal lines DATA and DATAN (of FIGS. 3 and 4).

It is possible, during such soft error-detection operations, for configuration address line ADD2 to be high at the same time that an attempt is being made to write local data into memory cell 212 (i.e., local address line LOCAL_ADD is also high). In that case, the high capacitance at ports DATA and DATAN can inhibit the ability to quickly or even successfully write the desired bit of local data into memory cell 212.

Moreover, FPGAs can be subjected to partial reconfiguration, during which portions of the configuration memory are reprogrammed (i.e., stored with new configuration data). During such partial reconfiguration, local data stored in dual-port memory cells, such as memory cell 212 of FIG. 2, may be lost.

SUMMARY

In one embodiment, the present invention is an integrated circuit having a configuration memory block comprising one or more rows of memory cells, wherein at least one row has a set of one or more dual-port memory cells, and each dual-port memory cell is adapted to store either configuration data or local data. The configuration memory block also has a different configuration address line for accessing each different row of memory cells and access control circuitry adapted to programmably prevent access to the set of one or more dual-port memory cells via the corresponding configuration address line, while simultaneous access to one or more other memory cells in the corresponding row is enabled via the corresponding configuration address line.

In another embodiment, the present invention is a method and apparatus for operating a configuration memory block in an integrated circuit. Access is prevented to a set of one or more dual-port memory cells in a row of the configuration block via a corresponding configuration address line, while access is simultaneously enabled to one or more other memory cells in the row via the corresponding configuration address line of the configuration memory block.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
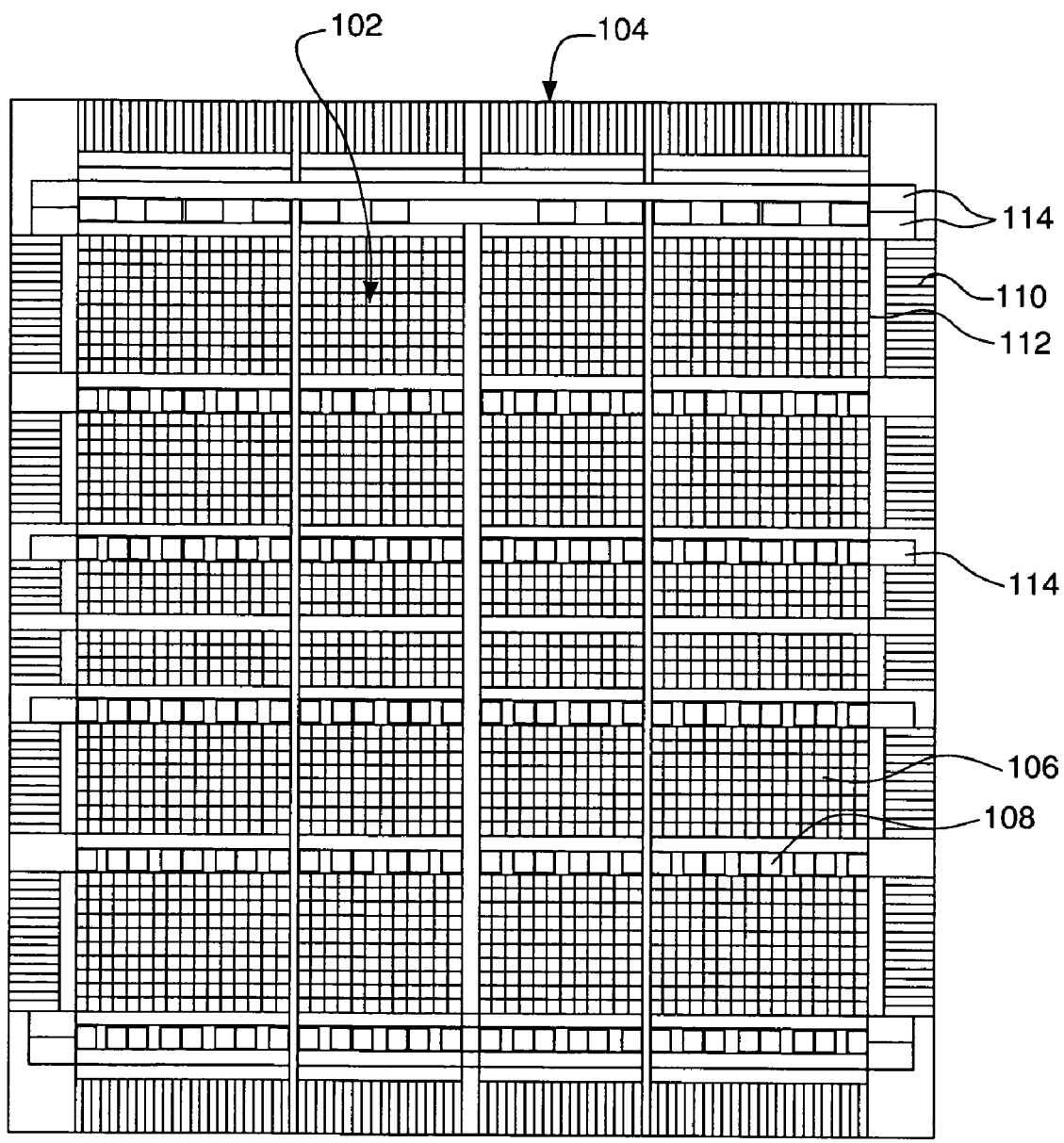
FIG. 1 shows a high-level block diagram of the layout of a conventional field-programmable gate array (FPGA)
Figure 2:
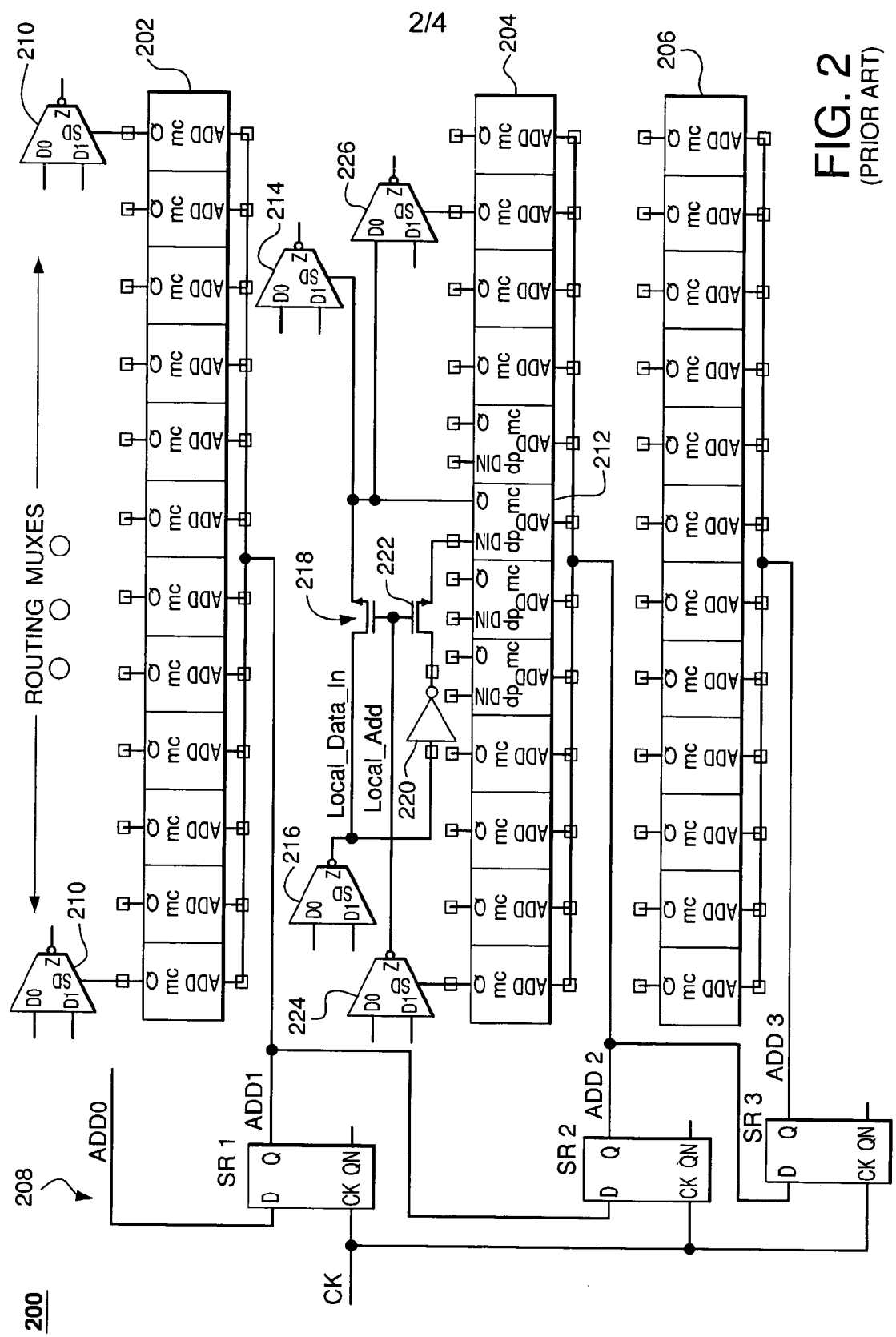
FIG. 2 shows a schematic block diagram of an exemplary conventional block of configuration memory for use in an FPGA, such as the FPGA of FIG. 1.
Figure 3:
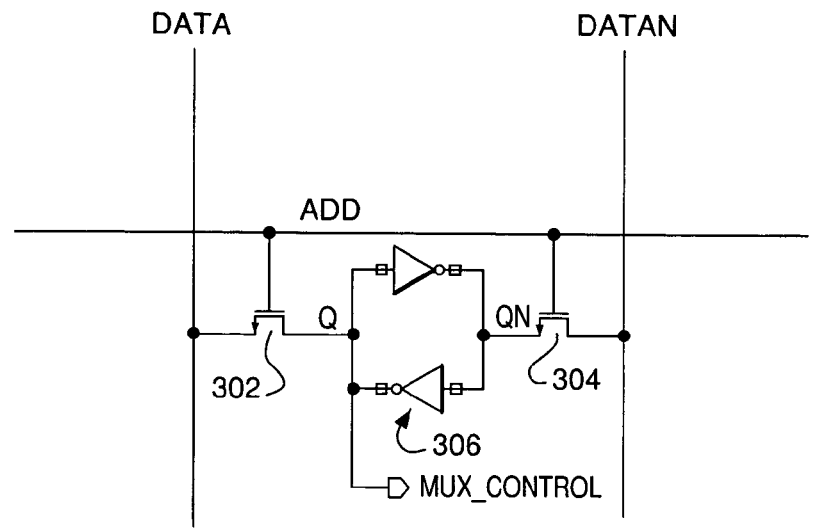
FIG. 3 shows a schematic diagram of a typical SRAM memory cell that can be used to implement each single-port memory cell in the configuration memory block of FIG. 2.
Figure 4:
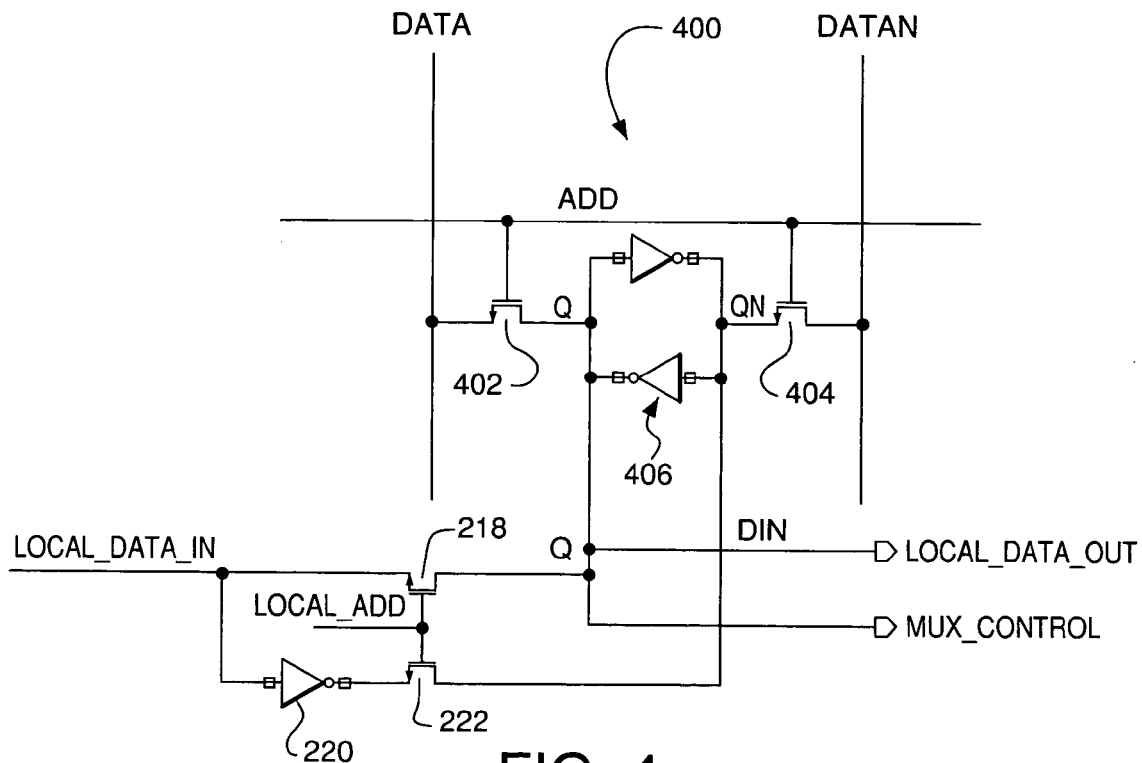
FIG. 4 shows a schematic diagram of a typical SRAM memory cell that can be used to implement each dual-port memory cell in the configuration memory block of FIG. 2.
Figure 5:
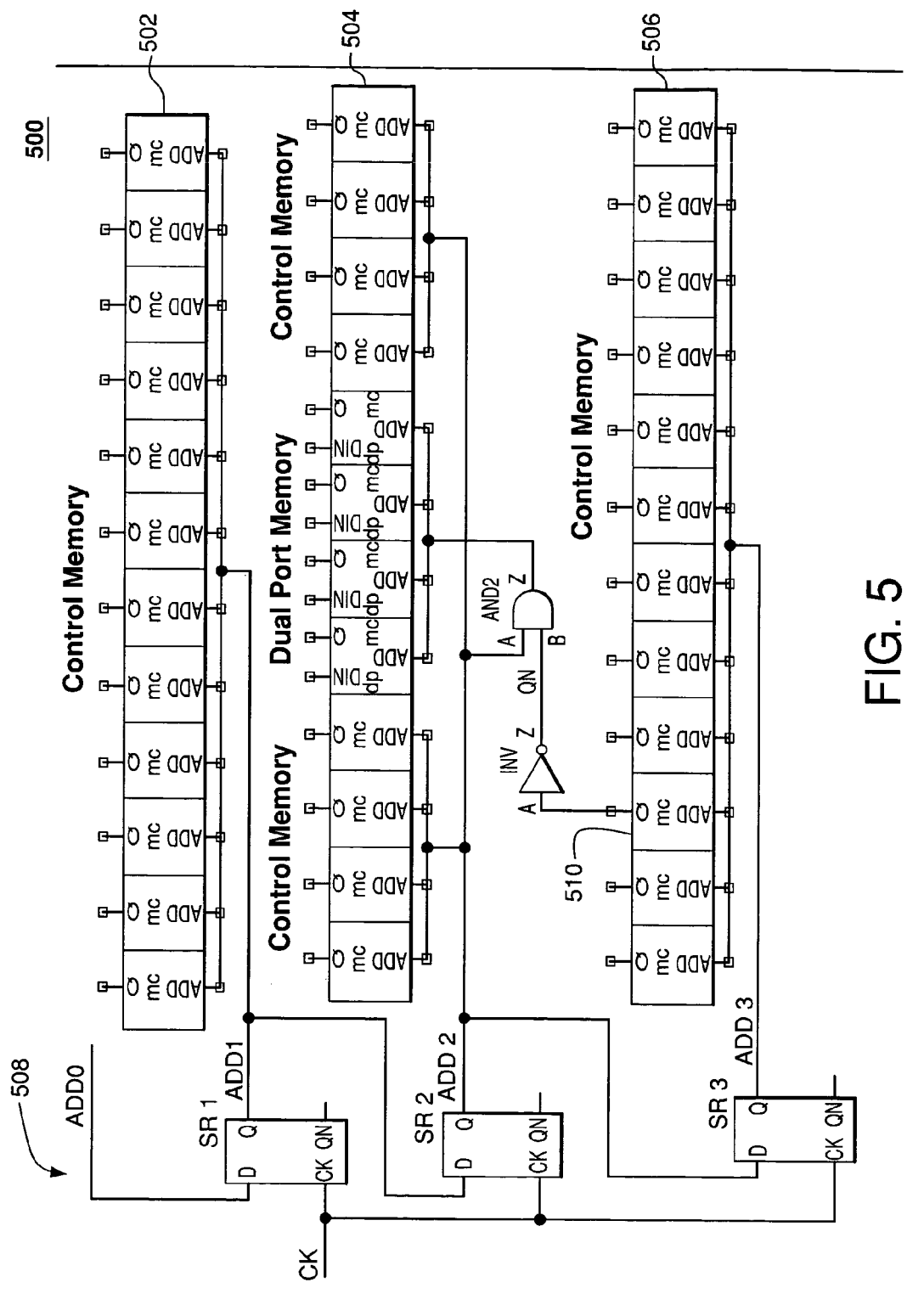
FIG. 5 shows a schematic block diagram of an exemplary block of configuration memory, according to one embodiment of the present invention, for use in an FPGA, such as the FPGA of FIG. 1.

FIG. 5 shows a schematic block diagram of an exemplary block 500 of configuration memory, according to one embodiment of the present invention, for use in an FPGA, such as FPGA 100 of FIG. 1. Like configuration memory block 200 of FIG. 2, configuration memory block 500 includes three rows 502–506 of SRAM memory cells and a shift register 508 formed by three flip-flops (FFs) SR1–3 connected in cascade to sequentially access rows 502–506, where rows 502 and 506 contain only single-port memory cells used only for configuration data, while row 504 includes, in addition to eight single-port memory cells, four dual-port memory cells that can be used for either configuration data or local data. Although not shown in FIG. 5, each of the four dual-port memory cells in row 504 has a set of additional circuitry similar to that represented in FIG. 2 for memory cell 212 for writing local data into that dual-port memory cell. Each of the single-port memory cells in configuration memory block 500 may be, but does not have to be, implemented as shown in FIG. 3, and each of the dual-port memory cells in configuration memory block 500 may be, but does not have to be, implemented as shown in FIG. 4.

Where configuration memory block 500 of FIG. 5 differs from conventional configuration memory block 200 of FIG. 2 is in the provision of additional access control circuitry used for controlling access to the dual-port memory cells in row 504. As shown in FIG. 5, address line ADD2 for row 504 is segmented, such that the signal on address line ADD2 is applied directly to the address ports ADD of the eight single-port memory cells in row 504, but is applied to the configuration address ports ADD of the four dual-port memory cells via logical-AND gate AND2. In particular, address line ADD2 is connected to data input port A of gate AND2, while data input port B of gate AND2 is connected to the output (Z) of inverter INV. The input (A) of inverter INV is connected to the output port Q of configuration cell 510 in row 506.

The particular circuitry shown in FIG. 5 is designed for FPGAs whose configuration memory is initialized to zero at power up. As such, when an FPGA containing configuration memory block 500 is initially power up, the value stored in each and every memory cell in FIG. 5, including memory cell 510, is zero. As such, when the FPGA is initially powered on, memory cell 510 will apply a value of 0 to inverter INV, which in turn will apply a value of 1 to the B input of gate AND2. This, in turn, will enable the configuration address ports ADD of the dual-port memory cells in row 504 to be controlled by the value on address line ADD2. As such, during the configuration processing associated with FPGA power up, when address line ADD2 is initially powered on during the normal sequential access of rows 502 through 506, the high value on address line ADD2 will pass through gate AND2 to enable the four dual-port memory cells in row 504 to be loaded with configuration data.

If the four dual-port memory cells in row 504 are not needed to store configuration data, then, when row 506 is subsequently accessed, memory cell 510 can be loaded with a configuration-data value of 1. When this high value is applied to inverter INV, the resulting low value applied to the B input of gate AND2 will ensure that the configuration address ports ADD of the four dual-port are maintained low, no matter what the value of address line ADD2 is.

In this way, the four dual-port memory cells in row 504 can be efficiently and accurately used to store local data without the risk that simultaneous access of those dual-port memory cells via their configuration address ports ADD will interfere with the writing of the local data. Note that, when the circuitry shown in FIG. 5 is used to prevent access via configuration address line ADD2 to the four dual-port memory cells in row 504, the data stored in those memory cells cannot be verified during conventional soft error-detection processing. However, since such access will typically be prevented only when the four dual-port memory cells are used to store local data, it is not as important to verify the validity of such data as it would be if those memory cells were used to store configuration data.

Moreover, during partial reconfiguration, when rows of configuration memory are reprogrammed in a sequential manner, the circuitry shown in FIG. 5 can be used to prevent local data stored in the four dual-port memory cells of row 504 from being overwritten. In particular, when address row ADD2 is powered to reconfigure the single-port memory cells in row 504, the "old" value of 1 still stored in memory cell 510 in row 506 will prevent access to the four dual-port memory cells in row 504, by gate AND2 blocking the signal on address row ADD2 from reaching the configuration address ports ADD of those dual-port memory cells.

Although the present invention has been described in the context of a particular exemplary block of configuration memory having three rows of memory cells, with 12 memory cells in each row, only single-port memory cells in the first and third rows and a single set of four dual-port memory cells in the middle of the second row, where that single set of dual-port memory cells is controlled by a single-port configuration memory cell located in the third row, the invention is not so limited. In general, the invention can be implemented in the context of other configuration memory blocks, including those having:

Other numbers of rows of memory cells;

Other numbers of memory cells in each row;

Dual-port memory cells in different rows, including more than one row;

More than one set of dual-port memory cells in a row;

Other numbers of dual-port memory cells in each set, including different numbers of memory cells in different sets and/or including a single dual-port memory cell in a set;

Access to each set of dual-port memory cells controlled by either a single-port memory cell or a dual-port memory cell; and/or The memory cell used to control access to a set of dual-port memory cells located in a row other than the immediately following row (in the shift-register sequence), although preferably in one of the subsequent rows (in the shift-register sequence).

In theory, access to a set of dual-port memory cells could be controlled by circuitry located outside of the block of configuration memory rather than by a memory cell of that block. Furthermore, in theory, one or more rows in the block could include all dual-port memory cells configured as one or more sets of memory cells.

Moreover, other circuitry can be used to implement logic analogous to that implemented by the particular access control circuitry shown in FIG. 5 (i.e., inverter INV and gate AND2). Note that the access control circuitry of FIG. 5 is designed for configuration memory that is initialized to zero at power up. Circuits, other than the cascaded flip-flops, can be used to sequence the address, for example, an external CPU or a sequentially delayed signal. Other circuitry implementing other suitable logic would be implemented for other types of configuration memory (e.g., having memory cells that are initialized to one at power up).

Although the present invention has been described in the context of configuration memory having single-port memory cells and dual-port memory cells, the invention can also be applied to other memory cells that can be accessed via either configuration address lines or local data address lines, including memory cells having more than two ports. In general, the term "dual-port memory cell" may be interpreted as covering any memory cell that supports both configuration-data access and local-data access. Note that the local port can be any suitable type of port including, but not limited to, a single-pass-gate port, a t-gate port, or a logic-gate-driven port.

Although the present invention has been described in the context of configuration memory have SRAM cells, the present invention can alternatively be implemented using other types of memory cells, including, but not limited to, dynamic RAM (DRAM) cells, virtual DRAM cells, and single transistor cells.

Although the present invention has been described in the context of FPGAs, those skilled in the art will understand that the present invention can be implemented in the context of other types of programmable devices, such as, without limitation, programmable logic devices (PLDs), mask-programmable gate arrays (MPGAs), simple programmable logic device (SPLDs), and complex programmable logic devices (CPLDs). More generally, the present invention can be implemented in the context of any kind of electronic device having programmable elements.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. An integrated circuit having a configuration memory block comprising:
   one or more rows of memory cells, wherein:
      at least one row has a set of one or more dual-port memory cells; and
      each dual-port memory cell is adapted to store either configuration data or local data;
   a different configuration address line for accessing each different row of memory cells; and
   access control circuitry adapted to programmably prevent access to the set of one or more dual-port memory cells via the corresponding configuration address line, while simultaneous access to one or more other memory cells in the corresponding row is enabled via the corresponding configuration address line.

2. The integrated circuit of claim 1, wherein:
   the configuration memory block comprises a plurality of rows of memory cells; and
   the configuration memory block further comprises a shift register adapted to sequentially power each configuration address line.

3. The integrated circuit of claim 1, wherein:
   the corresponding configuration address line is connected to a first input port of the access control circuitry;
   an access control line is connected to a second input port of the access control circuitry;
   an output port of the access control circuitry is connected to a configuration address port of each of the one or more dual-port memory cells in the set; and
   an access control signal on the access control line is adapted to programmably prevent the access control circuitry from passing a configuration address signal to the output port of the access control circuitry, where the configuration address signal is applied by the corresponding configuration address line to the first input port of the access control circuitry.

4. The integrated circuit of claim 3, wherein the access control signal is based on data stored in a memory cell in a subsequent row of the configuration memory block.

5. The integrated circuit of claim 3, wherein the access control circuitry comprises:
   an inverter connected to receive the access control signal; and
   a logical-AND gate connected to receive the configuration address signal and an output signal of the inverter, wherein an output signal of the logical-AND gate is the output signal of the access control circuitry.

6. The integrated circuit of claim 1, wherein the corresponding configuration address line is segmented such that:
   the corresponding configuration address line is connected directly to a configuration address port of each single-port memory cell in the row; and
   the corresponding configuration address line is connected to a configuration address port of each dual-port memory cell in the set via the access control circuitry.

7. The integrated circuit of claim 1, wherein the integrated circuit is an FPGA.

8. The integrated circuit of claim 1, wherein:
   the configuration memory block comprises a plurality of rows of memory cells;
   the configuration memory block further comprises a shift register adapted to sequentially power each configuration address line;
   the corresponding configuration address line is connected to a first input port of the access control circuitry;
   an access control line is connected to a second input port of the access control circuitry;
   an output port of the access control circuitry is connected to a configuration address port of each of the one or more dual-port memory cells in the set; and
   an access control signal on the access control line is adapted to programmably prevent the access control circuitry from passing a configuration address signal to the output port of the access control circuitry, where the configuration address signal is applied by the corresponding configuration address line to the first input port of the access control circuitry;

the access control circuitry is adapted to generate the access control signal based on data stored in a memory cell in a subsequent row of the configuration memory block;

the corresponding configuration address line is segmented such that:
- the corresponding configuration address line is connected directly to a configuration address port of each single-port memory cell in the row; and
- the corresponding configuration address line is connected to a configuration address port of each dual-port memory cell in the set via the access control circuitry.

9. The integrated circuit of claim 8, wherein:

the access control circuitry comprises:
- an inverter connected to receive the access control signal; and
- a logical-AND gate connected to receive the configuration address signal and an output signal of the inverter, wherein an output signal of the logical-AND gate is the output signal of the access control circuitry; and the integrated circuit is an FPGA.

10. A method for operating a configuration memory block in an integrated circuit, the method comprising:

preventing access to a set of one or more dual-port memory cells in a row of the configuration block via a corresponding configuration address line; and simultaneously enabling access to one or more other memory cells in the row via the corresponding configuration address line of the configuration memory block.

11. The method of claim 10, further comprising:

simultaneously enabling access to each dual-port memory cell in the set via a corresponding local address line of the configuration memory block.

12. The method of claim 10, wherein:

the access to the one or more other memory cells in the row via the corresponding configuration address line is enabled by applying a configuration address signal of the corresponding configuration address line to a configuration address port of each other memory cell in the row; and the access to the set of one or more dual-port memory cells in the row via the corresponding configuration address line is prevented by:
- applying the configuration address signal on the corresponding configuration address line to a first input port of access control circuitry of the configuration memory block;
- applying an access control signal having an access-prevention value to a second input port of the access control circuitry; and
- applying an output signal from the access control circuitry to a configuration address port of each dual-port memory cell in the set.

13. The method of claim 12, wherein access to the set of one or more dual-port memory cells in the row via the corresponding configuration address line is enabled by applying the access control signal having an access-enabling value to the second input port of the access control circuitry.

14. The method of claim 12, wherein the access control signal is based on data stored in a memory cell in a subsequent row of the configuration memory block.

15. Apparatus for operating a configuration memory block in an integrated circuit, the apparatus comprising:

means for preventing access to a set of one or more dual-port memory cells in a row of the configuration block via a corresponding configuration address line; and means for simultaneously enabling access to one or more other memory cells in the row via the corresponding configuration address line of the configuration memory block.

16. The apparatus of claim 15, further comprising:

means for simultaneously enabling access to each dual-port memory cell in the set via a corresponding local address line of the configuration memory block.

17. The apparatus of claim 15, wherein:

the access to the one or more other memory cells in the row via the corresponding configuration address line is enabled by means for applying a configuration address signal of the corresponding configuration address line to a configuration address port of each other memory cell in the row; and the access to the set of one or more dual-port memory cells in the row via the corresponding configuration address line is prevented by:
- means for applying the configuration address signal on the corresponding configuration address line to a first input port of access control circuitry of the configuration memory block;
- means for applying an access control signal having an access-prevention value to a second input port of the access control circuitry; and
- means for applying an output signal from the access control circuitry to a configuration address port of each dual-port memory cell in the set.

18. The apparatus of claim 17, wherein access to the set of one or more dual-port memory cells in the row via the corresponding configuration address line is enabled by means for applying the access control signal having an access-enabling value to the second input port of the access control circuitry.

19. The apparatus of claim 17, wherein the access control signal is based on data stored in a memory cell in a subsequent row of the configuration memory block.

* * * * *